United States Patent [19]

Suzuki et al.

[11] Patent Number: 4,526,646
[45] Date of Patent: Jul. 2, 1985

[54] INNER LEAD BONDER

[75] Inventors: Yasunobu Suzuki; Seiichi Chiba; Akihiro Nishimura, all of Tokyo, Japan

[73] Assignee: Shinkawa Ltd., Tokyo, Japan

[21] Appl. No.: 558,207

[22] Filed: Dec. 5, 1983

[30] Foreign Application Priority Data

Mar. 3, 1983 [JP] Japan .................. 58-35584

[51] Int. Cl.³ ............ B65G 25/00; B32B 31/00; B23P 19/00; B44C 1/00
[52] U.S. Cl. .................. 156/361; 156/363; 156/542; 156/567; 156/230; 29/740; 414/541; 198/408; 269/57
[58] Field of Search ............... 156/351, 358, 363, 361, 156/540, 541, 542, 566, 567, 556, 558, 368, 64, 91, 584, 230; 269/57, 903; 198/401, 408; 29/281.4, 281.3, DIG. 1, 740; 414/541, 540, 776

[56] References Cited

U.S. PATENT DOCUMENTS

| 3,743,558 | 7/1973 | Ludwig | 156/552 |
| 3,894,633 | 7/1975 | Egan et al. | 156/584 |
| 4,036,484 | 7/1977 | Schneeman | 269/57 |
| 4,116,376 | 9/1978 | Delorme et al. | 29/740 |
| 4,239,576 | 12/1980 | Taki et al. | 156/300 |
| 4,292,108 | 9/1981 | Weiss et al. | 156/361 |
| 4,372,802 | 2/1983 | Harigane et al. | 156/567 |
| 4,373,840 | 2/1983 | Miller, Jr. | 269/57 |
| 4,459,743 | 7/1984 | Watanabe et al. | 29/740 |

Primary Examiner—Edward Kimlin
Assistant Examiner—L. Falasco
Attorney, Agent, or Firm—Koda and Androlia

[57] ABSTRACT

An inner lead bonder for bonding dies to leads of carrier tape with improved positional accuracy and improved work efficiency. In the inner lead bonder, dies are fed to a die positioning spot one at a time and positioned. Then, said positioned die is carried to a bonding position. On the other hand, leads of a carrier tape are fed to the bonding position and positioned at the spot above the aforesaid die. Thereafter, the leads of the carrier tape are pressed onto the die and bonded by using a bonding tool. This inner lead bonder is characterized in that it includes a rotary table with the size covering the die positioning point and the bonding position, and after positioning the die on the rotary table, the rotary table is rotated in order to bring the die positioned as mentioned above to the bonding position to place the die at a proper position for bonding.

11 Claims, 4 Drawing Figures

INNER LEAD BONDER

BACKGROUND OF THE INVENTION

1. Field of the Invention

The present invention relates to an inner lead bonder for bonding dies to leads which are preliminarily provided in carrier tape at stated intervals.

2. Prior Art

In the existing art, there have been known two methods for inner lead bonding. The first method works as described below. A wafer formed of the plural number of dies resulted from the cutting of the wafer into the plural number of pieces at regular intervals is placed at a set position through positioning it on a table that is driven XYZ directions. A carrier tape to be fed intermittently to the area above the foregoing table is provided. Then, the bonding is carried out by directly pressing the carrier tape onto the die by a bonding tool provided above the carrier tape.

However, this method is defective in the following point. That is, because the positional matching between the die and the lead is performed through detecting the patterns of the die and the leads by using a camera provided at the position above the carrier tape, it is difficult to detect the positional deviation of the die pattern.

Also, there are some other problems. That is, the wafer is prepared by bonding it to a plate made of ceramic, glass, or other material, by using a low melting point adhesive, and slicing it at regular intervals. Therefore, during the bonding by directly pressing the carrier tape onto the wafer as mentioned above, the heat from the bonding tool is conducted to the dies around the die that is bonded. The heat thus conducted causes the adhesive to melt. This in turn affects the die to be readily deviated from the set position. In addition, it may happen that, due to the heat, the adhesive is melted out from the slicing lines of the neighboring dies and stains those adjacent dies by spreading up to their surfaces through capillarity, etc.

Furthermore, the inner leads of the carrier tape which are to be bonded must be prevented from coming to contact with pads of the dies neighboring to the die to be bonded. For this purpose, the portion of the carrier tape where the inner leads other than those to be bonded are coming to be situated nearby the bonding tool must be provided with a curve so that the above-mentioned inner leads other than those to be bonded are kept away from the die to be bonded. Such arrangement, however, brings about the undesirable effect on the carrier tape.

The second method works as mentioned below. A table whereon a wafer is placed and that is driven in XY directions is disposed at the location spearated from the bonding position for carrier tape. Between the foregoing bonding position and the table, a spot for positioning a die is provided. This die positioning point is provided with die positioning fingers serving to position the die. Then, a piece of the die is sucked up by vacuum from the wafer by the first carrier arm, and carried to the die positioning point. There, the die is set in position by the positioning fingers. Next, by vacuum, the second carrier arm sucks up the die that is positioned as mentioned above, and carries it to the bonding position. Thereafter, the bonding operation is carried out through pressing the carrier tape onto the die from above the carrier tape by using a bonding tool.

In this method, the die is positioned at the point separated from the bonding position. Therefore, there is an advantage in it that a camera provided at the location above the bonding position is required only to detect the leads of the carrier tape alone. However, there still accompanies the problem that the positional deviation of the die occurs during the suction and during the release from suction, since the die once positioned is again carried by the carrier arm through getting sucked up.

SUMMARY OF THE INVENTION

Accordingly, the present invention is intended to obviate the aforesaid disadvantage of the second method in the prior art, and the general object of the present invention is to provide an inner lead bonder whereby the high accuracy bonding is achieved with improved work efficiency.

BRIEF DESCRIPTION OF THE DRAWINGS

The principles and objects of the present invention will become more apparent in the following description in conjunction with the following drawings wherein like elements are given like reference numerals and wherein.

DETAILED DESCRIPTION OF THE INVENTION

Referring more particularly to the drawings, shown therein is an embodiment of the inner lead bonder in accordance with the teachings of the present invention.

Figure 1:
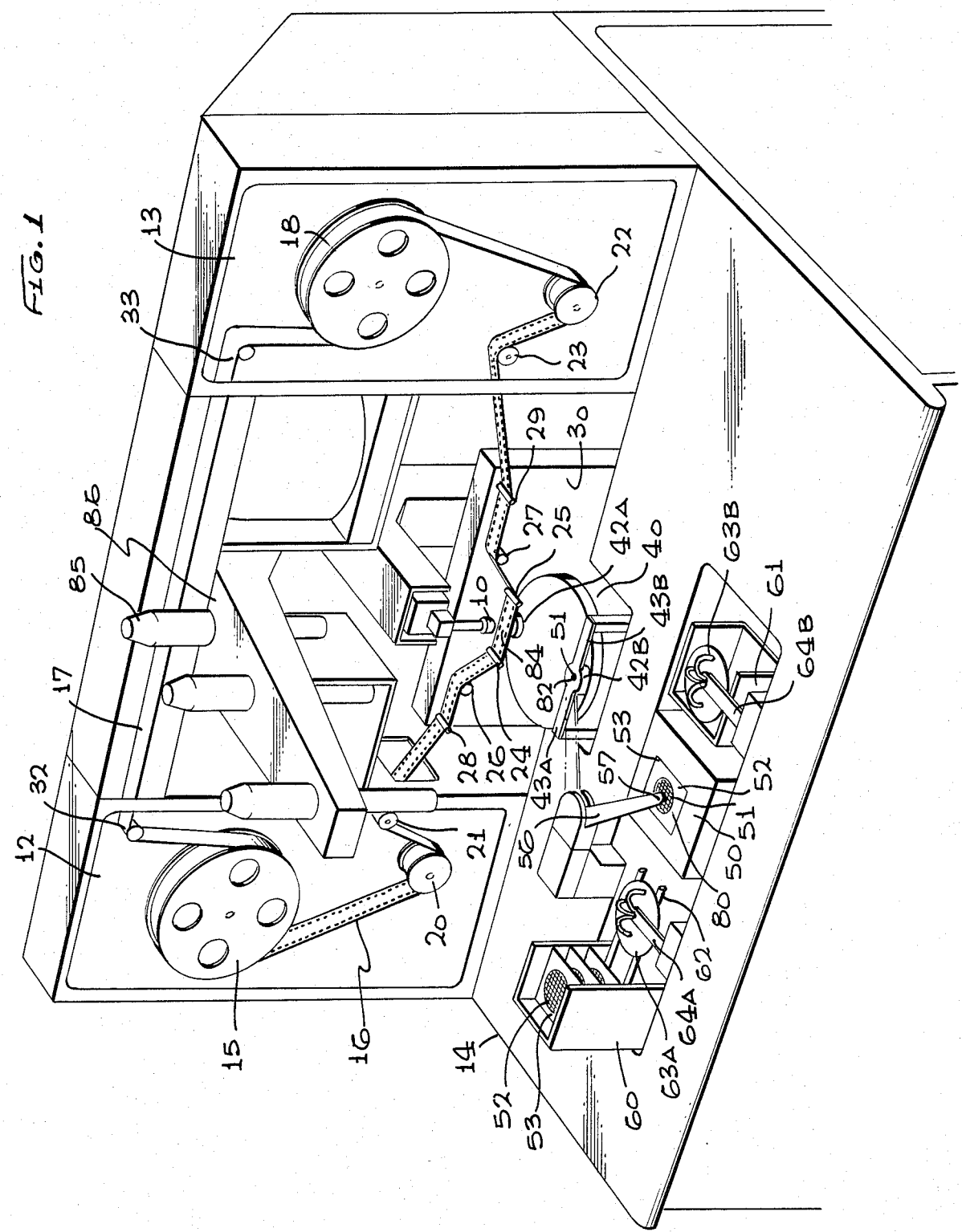
FIG. 1 is a perspective view showing an embodiment of the inner lead bonder to which the present invention is applied.
Figure 2:
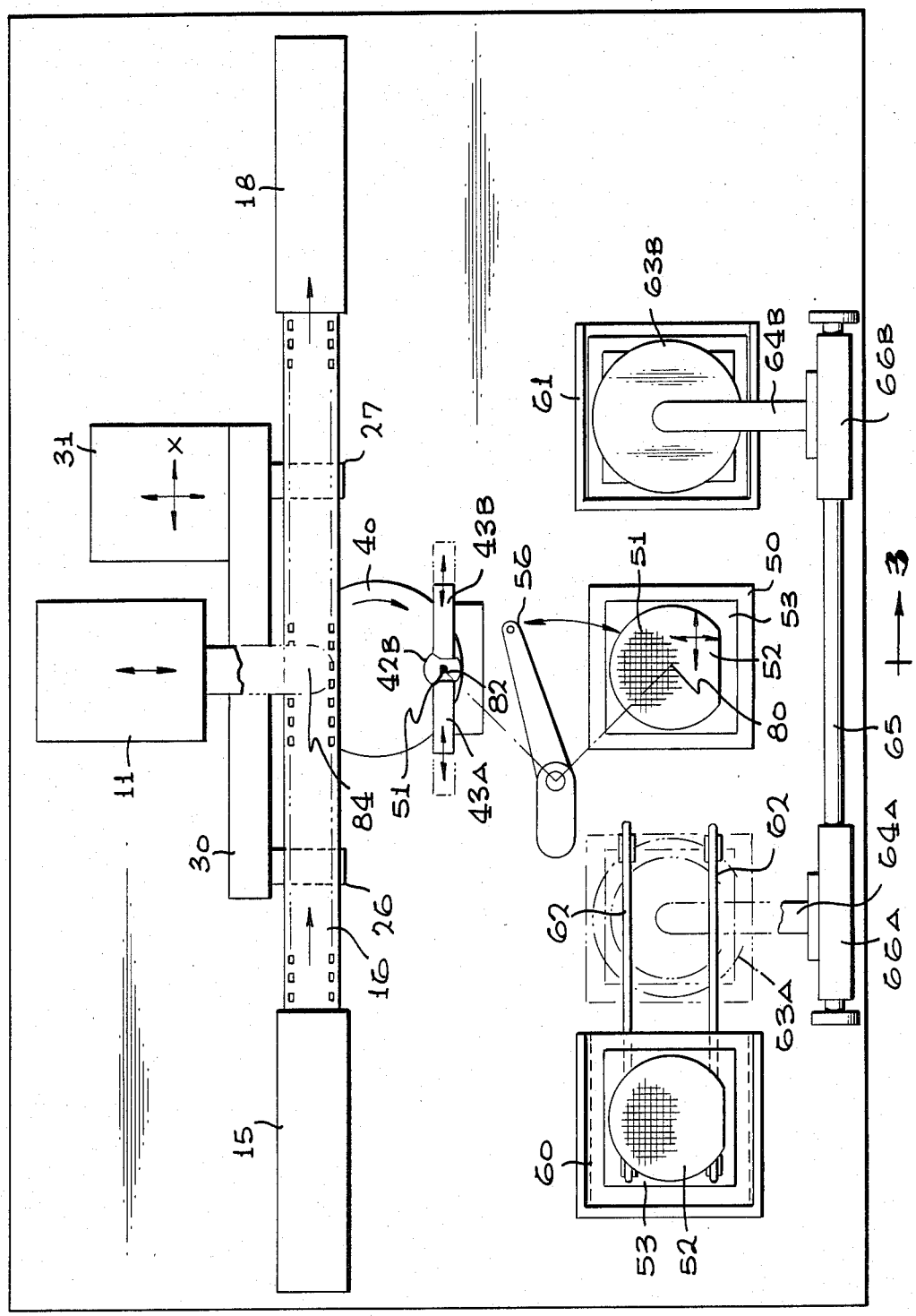
FIG. 2 is a plan view of FIG. 1.
Figure 3:
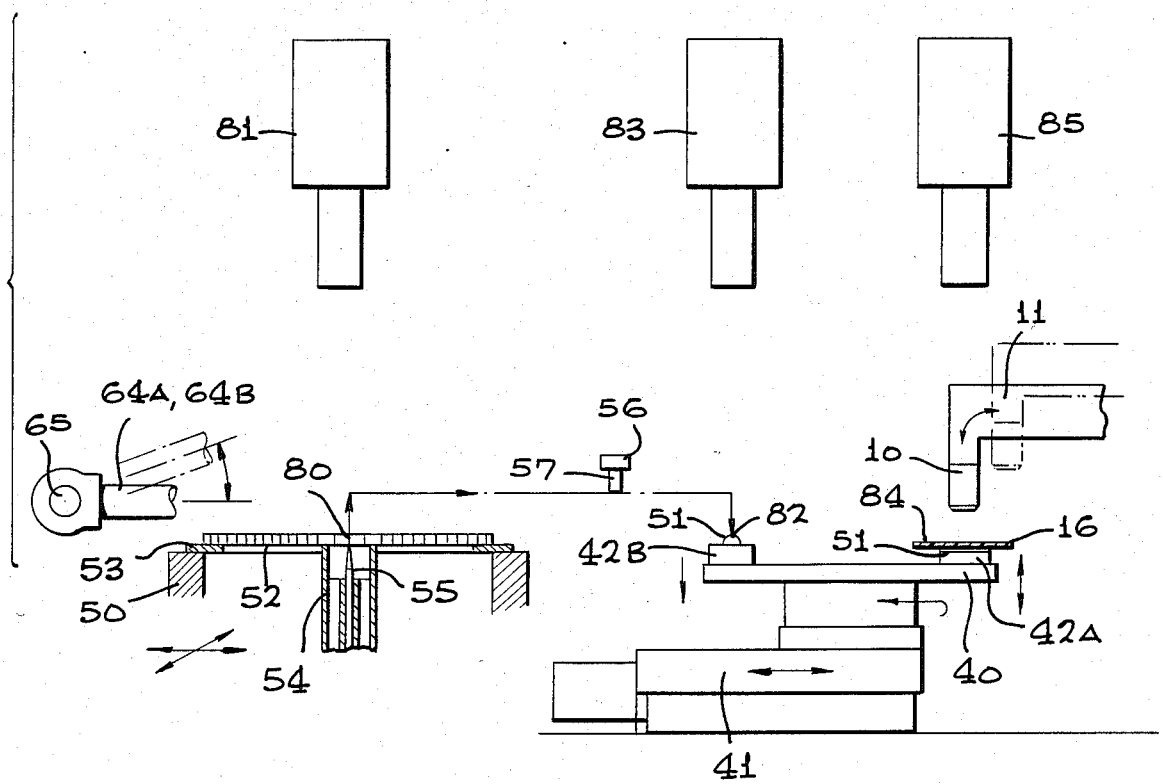
FIG. 3 is a diagrammatical side view taken along the arrow 3—3 in FIG. 2.

FIG. 1 is an overall perspective view showing an embodiment of the present invention. FIG. 2 is a plan view of FIG. 1. FIG. 3 is a diagrammatical side view taken along the arrow 3—3 in FIG. 2. On both sides of a bonding head 11 having a bonding tool 10, a tape loader section 12 and a tape unloader section 13 are disposed on a pedestal 14, respectively. In the tape loader section 12, a reel 15 is held in a freely rotatable manner. Onto the reel 15, a carrier tape 16 and a spacer tape 17 are wound in a form of dual layer. The carrier tape 16 is provided with leads disposed at regular intervals. The spacer tape 17 serves to protect the leads of the carrier tape 16. In the tape unloader section 13, a reel 18 is held in a freely rotatable manner. The reel 18 is used to reel the carrier tape 16 and the spacer tape 17 onto it in a form of dual layer. This reel 18 is run by a reel driving motor (not shown in the drawings).

Also, carrier tape guide rollers 20, 21, 22 and 23 are disposed in a freely rotatable manner in the tape loader section 12 and the tape unloader section 13, respectively. These carrier tape guide rollers 20, 21, 22 and 23 serve to guide the carrier tape 16, that is reeled on the reel 15, to below the bonding tool 10 and toward the reel 18. Furthermore, on both sides of the bonding tool 10, carrier tape guide rollers 24 and 25 are provided. Also, on both sides of these carrier tape guide rollers 24 and 25, sprocket wheels 26 and 27 which are to engage with sprocket holes formed on both sides of the carrier tape 16 are provided. In addition, on both sides of the sprocket wheels 26 and 27, carrier tape guide rollers 28 and 29 are provided. These carrier tape guide rollers 24 and 25, the sprocket wheels 26 and 27, and the carrier tape guide rollers 28 and 29 are all held by a tape position controlling panel 30 in a freely rotatable manner, respectively. The tape position controlling panel 30 is fixed to a XY table 31 that is driven along the XY directions. One of the abovementioned sprocket wheels, i.e., the sprocket wheel 27, is driven to rotate in a single direction by a stepping motor (not shown in the drawings). Also, in order to guide the spacer tape 17, that is reeled onto the reel 15, toward the reel 18, spacer tape guide rollers 32 and 33 are provided in a freely rotatable manner in the tape loader section 12 and the tape unloader section 13, respectively.

Below the bonding tool 10, a rotary table 40, is disposed with its rotation center deviated from the bonding tool 10. The rotary table 40 is driven to rotate as well as to move up and down, and it is mounted on Y table 41 that is driven in the Y direction. On the rotary table 40, die holding blocks 42A and 42B are fixed at the position right below the bonding tool 10 and at the position on a circle concentric to that whereupon the aforesaid position is located, respectively. Above the die holding block 42B, a pair of mutually facing die positioning fingers 43A and 43B are disposed with a space kept from the die holding block 42B in order to keep them from interfering with the movement of the die holding blocks 42A and 42B. The foregoing die positioning fingers 43A and 43B are designed to be opened/closed by a drive mechanism that is not shown in the drawings.

In front of the die positioning fingers 43A and 43B (on the opposite side of the bonding tool 10), a wafer holding XY table 50 is disposed. On the wafer holding XY table 50, a wafer base plate 53 is fixed in position. To the wafer base plate 53, a wafer 52 is fixed. The wafer 52 is composed of the plural number of dies 51 which are formed through dividing the wafer 52 at regular intervals into the plural number of dies. Also, inside of the wafer holding XY table 50, a plunger 54 is provided in a manner to be movable in vertical direction. The plunger 54 functions to suck the backside of the wafer 52 of the wafer base plate 53, placed in position on the wafer holding XY table 50, by means of vacuum. Inside of the plunger 54, a thrust-up needle 55 is provided in a vertically movable manner. This thrust-up needle 55 works to thrust up a single piece of die 51. Between the die positioning fingers 43A and 43B, and the wafer holding XY table 50, a die carrier lever 56 is disposed. The die carrier lever 56 is so disposed that it is able to move vertically as well as able to swing. The role of the die carrier lever 56 is to suck up a piece of die 51 on the wafer holding XY table 50 by vacuum and transfer the die 51 onto the die holding block 42B that is positioned below and between the die positioning fingers 43A and 43B.

On both sides of the wafer holding XY table 50, a loader side wafer base plate cassette 60 and an unloader side wafer base plate cassette 61 are provided. The loader side wafer base plate cassette 60 is designed to be driven in vertical direction. In the loader side wafer base plate cassette 60, the plural number of the wafer base plates 53 each having the wafer 52 fixed to it are stacked at equal intervals to be stored. Also, the loader side wafer base plate cassette 60 is opened on the side facing to the wafer holding XY table 50. Through this opening, a conveyor 62 extends itself from inside of the loader side wafer cassette 60 toward the wafer holding XY table 50. The unloader side wafer base plate cassette 61 is formed of a ⊐-shape box that is opened only on the top side and on the right side. The unloader side wafer cassette 61 serves to house the wafer base plates 53 in a form that the wafer base plates 53 are stacked directly one after another.

At the positions above the conveyor 62 and above the unloader side wafer base plate cassette 61, wafer suction plates 63A and 63B are provided, respectively. These wafer suction plates 63A and 63B are fixed to arms 64A and 64B, respectively. The arms 64A and 64B are in turn fixed to sliding sleeves 66A and 66B. The sliding sleeves 66A and 66B are held by a guide bar 65 in the manner to be freely slides as well as to be freely rotated. The guide bar 65 has the length covering the range from a side of the conveyor 62 to a side of the unloader side wafer base plate cassette 61. One of the sliding sleeves, i.e., the sliding sleeve 66A, is designed to reciprocate between the position over the conveyor 62 and the position above the wafer holding XY table 50. On the other hand, the sliding sleeve 66B is designed to reciprocate between the point above the wafer holding XY table 50 and the point above the unloader side wafer base plate cassette 61. For the reciprocatory movements, the sliding sleeves 66A and 66B are respectively driven by the driving gears which are not shown in the drawings.

Figure 4:
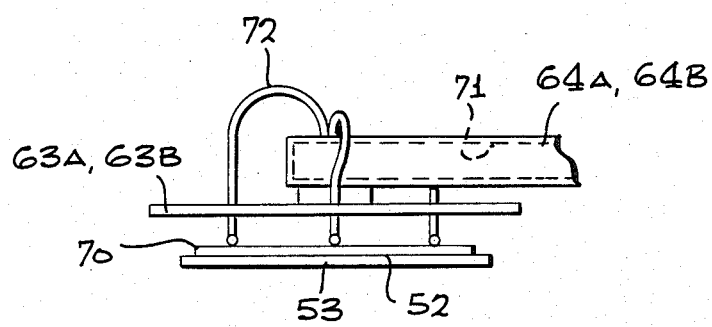
FIG. 4 is a side view showing the portion of the wafer suction plate.

As shown in FIG. 4, the wafer suction plates 63A and 63B are provided with the plural number of sucking discs 70 for sucking the wafer base plate 53 by vacuum. The sucking discs 70 are connected to vacuum cavities 71, formed inside of the arms 64A, and 65B, by way of pipes 72, respectively. The vacuum cavities 71 are connected through pipes to the vacuum unit (not shown in the drawings).

Furthermore, at the position above the foregoing thrust-up needle 55, that is, at the point above a die pick up position 80, a die defect detection camera 81 for detecting chipping, defective mark, etc. of the die 51 is provided. Also, at the position above a pair of the die positioning fingers 43A and 43B, that is, at the point above a die positioning point 82, a die positional pattern detecting camera 83 is provided. The die positional pattern detecting camera 83 serves to detect the positional pattern of the die 51. In addition, at the location above the carrier tape 16 and above the bonding tool 10, that is, at the location above a bonding position 84, a lead positional pattern detecting camera 85 is provided. The lead positional pattern detecting camera 85 detects the positional pattern of the leads in the carrier tape 16. These cameras 81, 83 and 85 are fastened to a camera holder 86 that is fixed to the pedestal 14.

Hereunder, the description will be given on the operation of the embodiment. When the loader side wafer base plate cassette 60 is brought down by one pitch by way of the vertical driving mechanism that is not shown in the drawings, the wafer base plate 53 at the bottom position comes to be placed on the conveyor 62. Next, the conveyor 62 is actuated by the driving mechanism that is not shown in the drawings, and the wafer base plate 53 is carried to the wafer holding XY table side. Then, the arm 64A is rotated downward; thus, the sucking discs 70 fixed to the wafer suction plate 63A come into contact with the wafer 52. In this state, the vacuum unit that is not shown in the drawings is actuated thereby causing the vacuum cavity 71 of the arm 64A to become vacuous, and the sucking discs 70 suck up the wafer 52 through the pipes 72. Thereafter, the arm 64A rotates upward and picks up the wafer 52 together with the wafer base plate 53 from the conveyor 62. After this operation, the sliding sleeve 66A moves toward the wafer holding XY table 50, and the wafer base plate 53 is carried to the position above the wafer holding XY table 50. Following these movements, the arm 64A is rotated downward and places the wafer base plate 53 in position on the wafer holding XY table 50. At this point, the wafer suction plate 63A is released from the vacuous state, and the arm 64A is rotated upward by leaving the wafer base plate 53 on the wafer holding XY table 50. Then, the arm 64A is moved to the position above the conveyor 62.

When the wafer base plate 53 is placed on the wafer holding XY table 50 in the manner as described above, the wafer base plate 53 is positioned and fixed onto the wafer holding XY table 50 by means of a positioning mechanism that is not shown in the drawings. Next, the wafer holding XY table 50 is driven in the XY directions by the drive mechanism that is not shown in the drawings, and the die to be picked up is moved to the die pick up position 80 right under the die defect detection camera 81. Then, by the die defect detection camera 81, the die 51 is checked if it is defective or not. If it is detected that the die 51 is defective, the next die 51 is moved to the die pick up position 80, and the checking is carried out in the same way. When the die 51 is clear of defect, the plunger 54 moves up, and the wafer 52 is sucked by vacuum as the vacuous state is effected in the plunger 54. Also, at the same time, the die carrier lever 56 is rotated to the spot directly above the die pick up position 80 by the drive mechanism that is not shown in the drawings, then it is moved downward (by the foregoing drive mechanism). By the operation as mentioned above, a vacuum suction collet 57 fixed to the end of the die carrier lever 56 comes to contact with the not-defective die 51 that was checked through the above-mentioned procedure. Then, by the vacuum effected in the vacuum suction collet 57, the die 51 is sucked up. Thereafter, as the die carrier lever 56 moves upward, the thrust-up needle 55 goes up concurrently and thrusts up the die 51. By this action, the die 51 is picked up through getting sucked up by the vacuum suction collet 57. After this operation, the die carrier lever 56 is rotated to the position above the die positioning point 82, then brought downward. As the result, the die 51 held through suction by the vacuum suction collet 57 comes to contact with the die holding block 42B. At this point, the vacuum suction collet 57 is released from the vacuous state. Next, the die carrier lever 56 moves up by leaving the die 51 on the die holding block 42B, then swings back to the original starting position. Also, when the die 51 is picked up from the wafer holding XY table 50 by the vacuum suction collet 57 of the die carrier lever 56 as described above, the wafer holding XY table 50 is driven in the XY directions, and the die 51 to be picked up next is checked by the die defect detection camera 81.

When, as mentioned previously, the die 51 is placed on the die holding block 42B, the die positioning fingers 43A and 43B are moved to the closing direction by the drive mechanism that is not shown in the drawings, and the die 51 is adjusted in position in terms of the XY directions as well as the $\theta$ direction. Thereafter, the die positioning fingers 43A and 43B are moved toward the opening direction. When the position of the die 51 with respect to the X direction is adjusted, the positional deviation along the Y direction is detected for the pattern of the die 51 by the die positional pattern detecting camera 83, and the result is stored in a memory unit that is not shown in the drawings. Then, the rotary table 40 is rotated 180 degrees, and the die holding block 42B on which the die 51 is placed comes to be located at the bonding position 84.

On the other hand, every time the sprocket wheel 27 is driven intermittently by the drive mechanism that is not shown in the drawings, the carrier tape 16 reeled on the reel 15 is fed through the carrier tape guide rollers 20, 21 and 28, the sprocket wheel 26, and the carrier tape guide roller 24, and the leads of the carrier tape 16 are fed to the bonding position 84. Also, the portion of the carrier tape 16 that is loosened between the sprocket wheel 27 and the reel 18 is detected by the detecting means that is not shown in the drawings. As a result of this operation, the reel 18 is driven by the drive mechanism that is not shown in the drawings, and the carrier tape 16 is reeled up onto the reel 18. At the same time, the spacer tape 17 wound on the reel 15 is fed to the reel 18 through the spacer tape guide rollers 32 and 33, and reeled up onto the reel 18 together with the carrier tape 16 in a form of dual layer. In this state, the bonding tool 10 stays at the position backed up from the point directly above the bonding position 84.

When the carrier tape is fed and the leads of the carrier tape 16 are placed at the bonding position 84 through the procedure taken as mentioned above, the position of the lead pattern of the carrier tape 16 is detected by the lead positional pattern detecting camera 85. Then, the positional deviation of the lead pattern of the carrier tape 16 from the pattern of the die 51 that was detected by the die positional pattern detecting camera 83 through the operation described previously is computed by means of an arismetic unit that is not shown in the drawings. In accordance with the value of the deviation thus computed, the XY table 31 is driven in the XY directions, and through the tape position controlling panel 30, the sprocket wheels 26 and 27 are moved. Because the teeth of the sprocket wheels 26 and 27 are engaged with the sprocket holes of the carrier tape 16, when the sprocket wheels 26 and 27 are moved as mentioned above, the portion of the carrier tape 16 between the sprocket wheels 26 and 27 is also moved as the table 40 rotates. This way, the positional matching between the lead pattern of the carrier tape 16 at the bonding position 84 and the pattern of the die 51 is carrier out.

Following the above-mentioned operational step, the rotary table 40 moves up, and the die 51 comes into contact with the leads of the carrier tape 16 with pressure applied to the die 51. At the same time, the bonding head 11 is driven by a cam mechanism (not shown) to cause the bonding tool 10 to move along a curved path from a first position wherein the bonding tool 10 is spaced apart from a line of view substantially perpendicular to the bonding position 84 to a second position wherein the bonding tool 10 is in operative contact with the leads of the carrier tape 16 on top of the die 51 adjacent the bonding site. Thereafter, the bonding tool 10 is moved back to the first position along the curved path by the cam mechanism. The rotary table 40 is then moved downward. At this point, the die bonding operation is completed for its one cycle. After the above, through repeating the foregoing opertional steps, the dies 51 are bonded to the leads of the carrier tape 16 one after another.

In this manner, the die bonding is performed in succession. When the not-defective dies 51 of the wafer 53 placed in position on the wafer holding XY table 50 are all used up, the sliding sleeve 66B is moved toward the wafer holding XY table 50, and the wafer suction plate 63B is brought to the point above the die pick up position 80. Following the above, the arm 64B is rotated in the downward direction, and the sucking discs 70 fixed to the wafer suction plate 63B come into contact with the wafer base plate 53. In this state, the vacuum unit that is not shown in the drawings is actuated to effect the vacuous state in the vacuum cavity 71 of the arm 64B, and through the pipes 72, the sucking discs 70 suck up the wafer base plate 53. Then, the arm 64B is rotated in the upward direction and picks up the wafer base plate 53 from the wafer holding XY table 50. Next, the sliding sleeve 66B is moved toward the unloader side wafer base plate cassette 61, and the wafer base plate 53 is brought to the spot above the unloader side wafer base plate cassette 61. At this point, the wafer suction plate 63 is released from the vacuous state, and the wafer base plate 53 is stored in the unloader side wafer base plate cassette 61. When the wafer base plate 53 is removed from the wafer holding XY table 50 by the operation as mentioned above, the wafer base plate 53 having the wafer 52 on it and that is stored in the loader side wafer base plate cassette 60 is again brought to the wafer holding XY table 50 and positioned on this wafer holding XY table 50 through the operation as described previously. Then, the foregoing bonding cycle is repeated in succession.

As mentioned above, in this embodiment, a rotary table 40 has the size covering the die positioning point 82 and the bonding position 84, and after the die 51 is positioned at the positioning point 82 on the rotary table 40, the die 51 thus positioned is brought to and placed at the bonding position 84 through the rotation of the rotary table 40. Therefore, the positional precision of the die 51 at the bonding position is determined by the rotational accuracy of the rotary table 40. Consequently, the die 51 is placed at the bonding position 84 without any risk of possible deviation in its position, and the high precision bonding can be achieved.

In the foregoing embodiment, the wafer 52 is fed to the wafer holding XY table 50, but a tray containing the separated dies may be supplied instead. Also, instead of providing two die holding blocks 42A and 42B on the rotary table 40, three or more die holding blocks may be disposed with the arrangement to rotate the rotary table 40 with the turning angle set in accordance with the number of the die holding blocks. In addition, the rotary table 40 is not necessarily be fashioned into the round shape, but it may be made into the form wherein only the portions of the die holding blocks 42A and 42B are connected. Furthermore, the die may be placed directly on the rotary table 40 without providing the die holding blocks 42A and 42B.

From the description given above, it is apparent that in the present invention, the die is positioned on the rotary table, then, by turning the rotary table, the die that is positioned as mentioned above is placed in position at the bonding position. Accordingly, the high precision bonding is performed.

Also, at the die positioning point, the die is positioned in terms of the X direction as well as the $\theta$ direction, and the correction is made by detecting the deviation in the Y direction. Therefore, the facing surfaces of a pair of die positioning fingers may be flat. Consequently, it is not necessary to exchange the die positioning fingers according to the size of the die, whereby contributing to the remarkable improvement in applicability for any die as well as in work efficiency.

We claim:

1. An inner lead bonder for bonding leads of a lead frame carried on a film carrier to a die of the type having a plurality of bonding pads when said die is at a bonding position, said inner lead bonder characterized by:

a rotary table having said bonding position located thereon and a die positioning spot angularly displaced from said bonding position, said rotary table being arranged and configured such that said bonding position and said die positioning spot can be interchanged by rotating said table;

a means for sensing the position of said die when said die is located at said die positioning spot;

a means for sensing the position of said lead frame on said film carrier;

a means for moving said film carrier with said lead frame thereon relative to said bonding position in response to the sensed position of said die and the sensed position of said lead frame on said film carrier when said table is rotated to interchange said bonding position and said die positioning spot; and a means for positioning said die in XY direction as well as $\theta$ direction said rotary table when said die is at said die positioning spot;

whereby in response to the sensed position of the die and the sensed position of the lead fame, the means for moving the film carrier relative to said bonding position moves said film carrier to align said die with said lead frame as said rotary table is rotated such that said die positioning spot and said bonding position are interchanged.

2. An inner lead bonder according to claim 1, wherein said means for sensing the position of said die comprises a first camera located above said die positioning spot.

3. An inner lead bonder according to claim 2, wherein said means for sensing the position of said lead frame on said film carrier comprises a second camera located above said bonding position.

4. An inner lead bonder according to claim 3, wherein said means for moving said film carrier relative to said bonding position comprises an XY table.

5. An inner lead bonder according to claim 4, further comprising a means for placing dies at said die positioning spot.

6. An inner lead bonder according to claim 1, wherein said rotary table is designed to be rotatable and to be movable in the vertical direction.

7. An inner lead bonder according to claim 1, wherein said means for positioning of said die is provided above said rotary table in such a manner that said means does not interfere the motion of said rotary table.

8. An inner lead bonder according to claim 7 wherein said means for positioning said die comprises a pair of fingers to pinch said die.

9. An inner lead bonder for bonder for bonding leads of a lead frame carried on a film carrier to die of the type having a plurality of bonding pads when said die is at a bonding position, said inner lead bonder characterized by:

a rotary table having said bonding position located thereon and a die positioning spot angularly displaced from said bonding position, said rotary table being arranged and configured such that said bonding position and said die positioning spot can be interchanged by rotating said table;

a means for moving said film carrier with said lead frame thereon relative to said bonding position;

a means for sensing the position of said die when said die is located at said die positioning spot;

a means for sensing the position of said lead frame on said film carrier;

a XY table for carrying a wafer base plate in position, said XY table being located by said rotary table;

a means for positioning said die in a $\theta$ direction on said rotor table when said die is at said die positioning spot;

a means for transferring a die from said wafer base plate to said die positioning spot; and whereby in response to the sensed position of die and the sensed position of the lead frame, the means for moving the film carrier relative to said bonding position moves said film carrier to align said die with said lead frame as said rotary table is rotated such that said die positioning spot and said bonding position are interchanged.

10. An inner lead bonder according to claim 9, wherein a means for sensing the position of said die being picked up by said means for transferring the die upon said wafer base plate, said means being located above said XY table.

11. An inner lead bonder according to claim 10, wherein a bonding tool for bonding said leads of said lead frame to said die is moved by a cam mechanism along a curved path from a first position wherein said bonding tool is spaced apart from a line of view substantially perpendicular to said bonding position to a second position wherein said bonding tool is on a line of view substantially perpendicular to said bonding position.

* * * * *